Oct. 25, 1966 HISASHI KANEKO 3,281,828

ENCODER WITH NON-LINEAR QUANTIZATION

Filed Aug. 27, 1963

Inventor
H. KANEKO
By [signature]
Attorney

United States Patent Office 3,281,828

Patented Oct. 25, 1966

3,281,828

ENCODER WITH NON-LINEAR QUANTIZATION

Hisashi Kaneko, Minato-ku, Tokyo, Japan, assignor to Nippon Electric Company Limited, Tokyo, Japan, a corporation of Japan Filed Aug. 27, 1963, Ser. No. 304,798
Claims priority, application Japan, Sept. 17, 1962, 37/40,296
7 Claims. (Cl. 340—347)

This invention relates to an encoder of the counter type for use as an encoder of pulse code modulation (PCM) and an analogue-digital converter, and more particularly to an encoder of the type with non-linear quantization for converting continuous or analogue signals into non-linearly quantized digital signals without using inherent non-linear characteristics of active non-linear circuit elements.

Conversion into digital signals by sampling, quantizing, and encoding analogue signals representing an analogue quantity, such as voice, picture, data, and others provides excellent technical advantages, such as increase in freedom from noise during transmission and processing of the information. Analogue signals or, as the case may be, sampled analogue signals are usually quantized with equal quantization steps. However some types of analogue signals such as voice signals, wherein signal levels of smaller amplitude occur frequently as viewed from the standpoint of probability, are preferably quantized with minor quantization steps for signals of smaller amplitudes as compared with quantization steps for signals of larger amplitudes. For such non-linear quantization, analogue signals have been companded by an instantaneous compandor, in which the inherent non-linear characteristics of non-linear circuit elements such as semiconductor devices or vacuum tubes are utilized, and then quantized linearly. With such non-linear quantization whose characteristics are dependent on the inherent non-linear characteristics of the non-linear circuit elements, uniform non-linear quantization characteristics have not been obtained because of temperature dependency of the circuit characteristics.

Logarithmic companding characteristics are preferable for several reasons such as that the signal-to-noise ratio is independent of the input signal levels, and that human senses are in logarithmic relation to the stimulus, as is known as the Weber-Fechner's law. Meanwhile, it is known in an encoder of the counter type, that the frequency of the counting pulse must be high as compared with the sampling frequency, while it is limited by the speed of the binary counter for use in counting such pulses. Consequently the sampling frequency and accordingly the speed of the encoder is low. The encoder of the counter type is, however, excellent in that the construction is very simple.

According to an aspect of the invention, the conventional linear function generator in an encoder of the counter type is replaced with an exponential function generator so as to result in an encoder with the logarithmic quantization. An exponential function generator has better stability than a conventional linear function generator. Furthermore, it is easy with an encoder of the type wherein an exponential function generator is used to compensate the error which would otherwise be caused by the sampled voltage holding circuit in the encoder. This aspect can therefore provide an encoder with logarithmic quantization with a very simple construction.

Therefore, an object of the invention is to provide an encoder of the counter type wherein no utilization is made of the inherent non-linear characteristics of a non-linear circuit element such as a semiconductor device and whose non-linear quantization characteristics are not only subject not to temperature but also are uniform from encoder to encoder.

Another object of the invention is to provide an encoder of the kind which has excellent precision and yet is simple in construction.

Still another object of the invention is to provide an encoder of the kind having logarithmic companding characteristics.

Now the invention will be described with reference to the accompanying drawings, in which.

Figures 1, 2, 3A, 3B, 4:
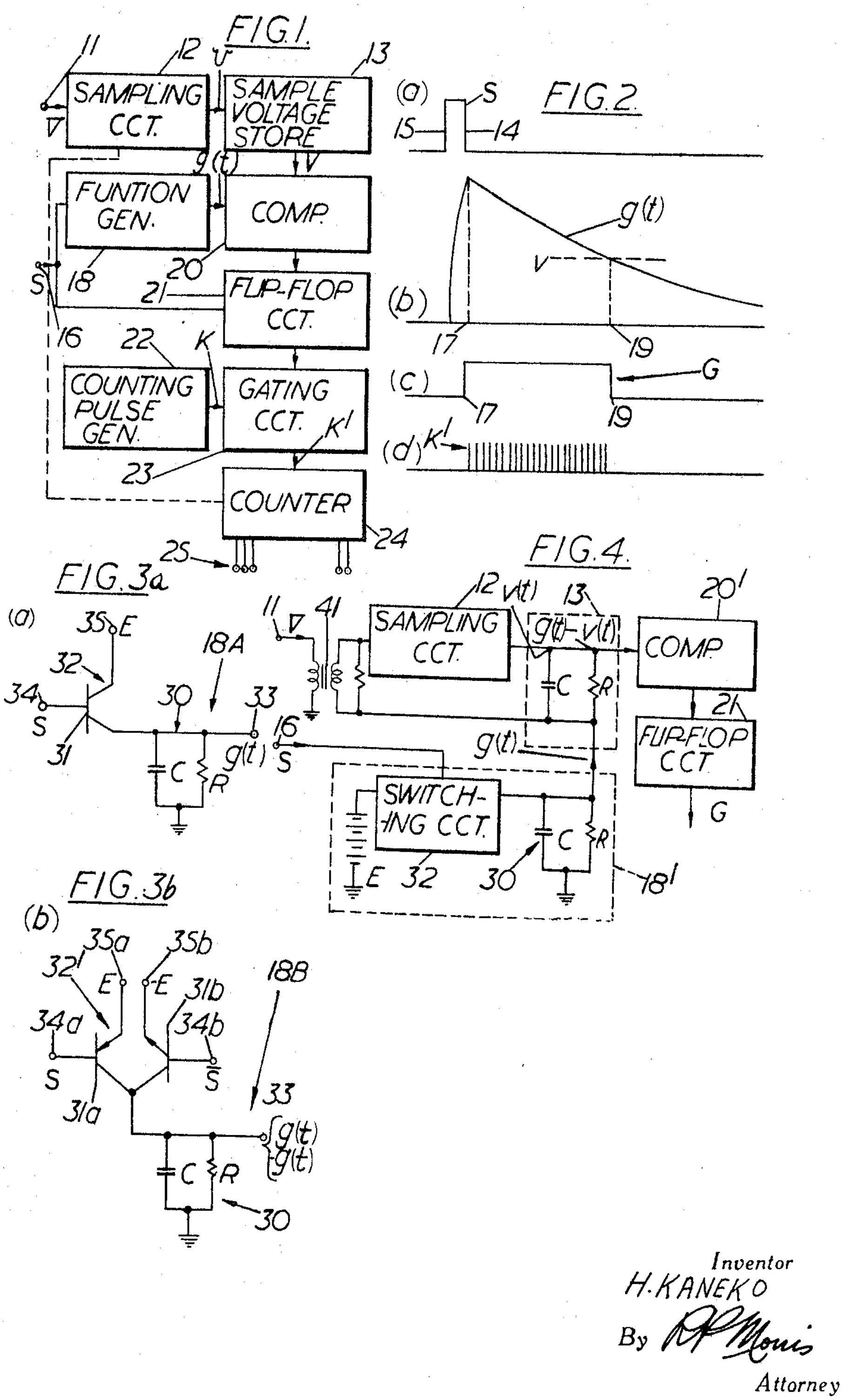
FIG. 1 is a block diagram of an encoder which constitutes an embodiment of the invention when the function generator of this invention is used.
FIG. 2 shows waveforms for explaining the function of the encoder of FIG. 1, wherein the voltage produced by the function generator is that used in an embodiment of the invention.

FIGS. 3(*a*) and (*b*) are circuit diagrams of exponential function generators each representing an essential part of the invention; and FIG. 4 is a circuit diagram of a portion of a more practical embodiment of the invention wherein an exponential function generator is employed.

Referring to FIGS. 1 and 2, a general encoder of the counter type shown in FIG. 1 comprises an input terminal 11 for receiving a positive or negative unidirectional analogue signal V to be converted to a digital signal composed of binary codes of $n$ bits and for serving as a source of such an analogue signal V; a sampling circuit 12 for sampling such input voltage V; a sampled voltage holding circuit 13 for storing a voltage $v$ representing the input voltage V at the time point of sampling and for holding the stored sampled voltage $v$; a start pulse input terminal 16 supplied with a quantization start pulse S, such as shown in FIG. 2(*a*), having a trailing edge 14 at a point in time at least not earlier than such time as the sampled voltage V has been completely stored in the sampled voltage holding circuit 13 and which will become the beginning of the encoding operation and having its leading preselected point in edge 15 at time ahead of trailing edge 14; a function generator 18 triggered by the start pulse S for producing a reference voltage for encoding such as shown in FIG. 2(*b*), determined in general by an exponential function $g(t)$ extending from the time point of the trailing edge 14 of the start pulse S as shown in FIG. 2(*b*) by 17 for a predetermined maximum time interval T; a comparator 20 for producing an output pulse or signal at a time point, shown in FIG. 2(*b*) by 19, at which the reference voltage $g(t)$ [shown for convenience by the same symbol as the single-valued function $g(t)$] has become equal to the stored sampled voltage $v$; a flip-flop circuit 21 which is turned on by the start pulse S at the time point 17 of the trailing edge 14 thereof shown in FIG. 2(*c*) and returned off by the output pulse of the comparator 20 at a time point of occurrence of such output pulse shown in FIG. 2(*c*) by 19; a counting pulse generator 22 for producting counting pulses K whose frequency $f_0$ is determined by $$f_0=N/T$$

in relation to the maximum encoding time interval T and the code length $n$ of the digital signal to be obtained or the maximum number N, or $2n$, to be represented by the digital signal; a gate circuit 23 supplied with the counting pulses K and an output of the flip-flop circuit 21 or a gate pulse G continuing as shown in FIG. 2(*c*) from the time point 17 of beginning of encoding until the other time point 19 where $$v=g(t)$$

so as to send out to the output side some of the supplied counting pulses K during continuance of the gate pulse G; an $n$-bit binary counter 24 supplied with gated counting pulses K′ of the gate circuit 23 for counting the pulses which are contained in the gated counting pulses K′ and whose number is, as shown in FIG. 2($d$), in one to one correspondence with the stored sampled voltage $v$ in relation to the reference voltage $g(t)$; and $n$ sets of output terminals 25 associated with the binary counter 24 for providing the result of the counting, digit by digit, as digit pulses of "1" or "0."

The digit pulses $n$ in number, produced at the output terminals 25 when the encoding or the counting has been completed or when it has passed the maximum encoding time interval T from the trailing edge 14 of the start pulse S form a combination of binary codes representing the number of those unit times or the periods $1/f_0$ of the counting pulses K contained in the time interval between the beginning of encoding and appearance of the output pulse of the comparator 20, or in other words, a code combination (codeword) representing a voltage obtained by quantizing the sampled voltage V with reference to the single-valued exponential function $g(t)$. Such $n$ digit pulses serve as a parallel output of the desired digital signal and also serve, if sent out one after another through a delay line, as a serial output of the desired digital signal. Those skilled in the art can readily multiplex a plurality of digital signals obtained in this manner if desired, or they may multiplex sampled analogue signals prior to quantizing and encoding.

When the sampled voltages V are picked up during each predetermined time period, the maximum encoding time T must be so selected that the period may not be at least shorter than the sum of the maximum encoding time interval T plus the time interval between the time point of sampling and the time point at which the sampled voltage V has been stored in the sampled voltage holding circuit 13. The width of the starting pulse S is so selected as to energize sufficiently the function generator 18 as required. It will be seen that the time point of sampling must be timed by a circuit not shown in FIG. 1 in relation to the time point at which the start pulse S is supplied to the start pulse input terminal 16. The comparator 20 may suitably be a blocking oscillator, a Schmitt circuit, or others described by Millman and Taub in "Pulse and Digital Circuit," pp. 469–480, published in 1956 by McGraw-Hill. The $n$-bit binary counter 24 may be $n$-stage flip-flop circuits, each provided with one of the output terminals 25. The binary counter 24 is timed by the circuit not shown in FIG. 1 so as to be reset prior to beginning of encoding by a reset pulse, such as the leading edge 15 of the start pulse S, to be ready for counting the gated counting pulses K′ supplied thereto after the beginning of encoding. The timing of the function generator, the sampling circuit and the counter reset is indicated by the dash line in FIG. 1.

In a conventional encoder of the counter type, the function generator 18 has been a linear function generator which produces a reference voltage given by either a linear function $$g(t)=E\cdot(f_0/N)\cdot t \qquad (1)$$

or another linear function $$g(t)=E\cdot[1-(f_0/N)\cdot t] \qquad (2)$$

where E is a predetermined voltage which may not be smaller than the maximum value of the input voltage V. Whereas, the spirit of the invention bases on the fact that a non-linear function generator has been obtained for providing a reference voltage given by a non-linear function $g(t)$ derived from the non-linear characteristics required in encoding, whereby the invention can provide a non-linear quantization encoder of the counter type.

Now consideration will be given to a signal whose voltage $g(t)$ at the time $t$ is given by $$g(t)=E\cdot\exp(-t/T_0) \qquad (3)$$

where E is a voltage predetermined so as not to be smaller than the sum of the maximum value of the input voltage V and a minute voltage $d$ to be later explained, and where $T_0$ is a constant having the dimension of the time. The origin of the time ($t=0$) is the time point of the trailing edge 14 of the start pulse S. It is also to be noted that the period of the counting pulses K is $1/f_0$. The number $i$ of the gated counting pulses K′ is, therefore, given by $$g(i/f_0)=E\cdot\exp(-i/[f_0\cdot T_0]) \qquad (3')$$

from which by substitution of $$r=\exp(-i/f_0\cdot T_0]) \qquad (4)$$
$$g(i/f_0)=E\cdot r$$

follows. Now let us introduce a voltage $x$ given by $$x=g(i/f_0)-d \qquad (5)$$

where $d$ is given by $$d=E\cdot r_N$$

and is a minute voltage. By putting $$r=(1+u)^{-1/N} \qquad (6)$$

and $$E_0=E\cdot(u/[1+u])$$

we can obtain $$i/N=\log(1+ux/E_0)/\log(1+u) \qquad (7)$$

which represents the logarithmic companding characteristics (or the "mu" characteristics) described by Bernard Smith in "Bell System Technical Journal," 1957 May issue, pp. 653–709. It follows therefore that the voltage $x$ given by the Equation 5 can serve as the desired reference voltage for logarithmic quantization. Incidentally, a constant $r$ in the Equations 4 and 5 is equal to the ratio of voltages $g(t)$ at the time points where the $i$th and the $(i+1)$th counting pulses K appear; another constant $E_0$ in the Equation 7 represents a voltage to be predetermined so as not to be smaller than the maximum value of the voltage $x$ or of the input voltage V; and still another constant $u$ in the Equation 6 and hence in the Equation 7 is a constant which gives the degree of compansion and is usually written in a Greek letter "mu."

It will thus be seen that a voltage $x$ in the Equation 5 or 7 must be produced for logarithmic quantization and that the voltage $g(t)$ given by the Equation 3 or 3′ may be used as a reference voltage for the logarithmic quantization by adjusting the minute constant voltage $d$ by the bias in the comparator 20 so that the output pulse may be obtained therefrom when the stored sampled voltage $v$ is smaller than the reference voltage $g(t)$ by the minute voltage $d$ or in short when a predetermined relation holds between such voltages. Such a reference voltage $g(t)$ is very stable because the voltage corresponds to the voltage appearing in natural discharge of a passive circuit.

Referring now to FIG. 3($a$), a unidirectional exponential function generator 18A for producing the voltage $g(t)$ given by the Equation 3 or 3′ comprises a passive circuit 30 consisting of a parallel circuit of a resistor R of resistance R and a capacitor C of electrostatic capacity C; a switching circuit 32 having a switching element 31 for either charging the passive circuit 30 or suspending such charging to leave the passive circuit 30 for the natural discharge (decay); and output terminal means 33 for deriving voltage appearing across the passive circuit 30. In this unidirectional exponential function generator 18A it will be seen that a switching transistor is used as the switching element 31. When a start pulse S is applied to a start pulse input terminal 34, the transistor 31 supplies a voltage E being continuously supplied to a power input terminal 35, to the passive circuit 30 to charge the capacitor C. After the voltage across the capacitor C has risen as shown in FIG. 2($b$) near to the voltage E, the start pulse S ceases with the result that the electric charge stored in the capacitor C naturally discharges through the resistor R. By so selecting the time constant of the passive circuit 30 that the relation $$RC=T_0 \qquad (8)$$

may hold, it is possible to obtain across the output terminal means 33 the voltage $g(t)$ given by the Equation 3 or 3′. The switching circuit 32 is in the off state throughout the encoding period, with the result that it is possible to neglect the effect of the switching circuit 32 during the encoding operation. In an example in which $n$ is 6, $u$ is 100, $f_0$ is 10 mc., and consequently $r$ is 0.9304, it follows that $$1/T_0=0.0696f_0=69.6\times10^3 \text{ sec.}^{-1}$$

or, namely, $T_0=14.4$ microseconds, and that selection may, for example, be $$R=14.4 \text{ kiloohms}$$

and $$C=1000 \text{ picofarads}$$

In general, an exponential function generator whose output voltage $g(t)$ is given by the natural discharge of a passive circuit, can provide very stable logarithmic quantization characteristics which unexpectedly surpass the conventional linear quantization characteristics. More particularly, it is indispensable in linear quantization to provide the voltage given by either $$g(i/f_0)=E\cdot i/N \qquad (1')$$

or $$g(i/f_0)=\cdot(1-i/N) \qquad (2')$$

in very precise accuracy. Thus, a linear function generator, which may be a phantastron circuit or a bootstrap circuit, described in the cited Millman and Taub book, pp. 221–235, must have such a precise linearity that its irregularity may be neglected as compared with a very small fraction such as 1/256 for eight-digit encoding where $N=2^8=256$. In contrast, the exponential function generator of the invention is very advantageous because the generator behaves like a substantially perfectly naturally discharging RC circuit, provided that the switching circuit 32 has a large on-off impedance ratio and that the input impedance of the comparator 20 connected to the output terminal means 33 is sufficiently large and because the stray capacity may be amalgamated with the electrostatic capacity of the capacitor C.

Referring to FIG. 3(*b*), a bidirectional exponential function generator 18B comprises a passive circuit 30; a switching circuit 32′; and output terminal means 33, like the exponential function generator 18A. The switching circuit 32′ comprises two switching elements 31*a* and 31*b* which are shown as a pnp and npn transistor, respectively, one of which turn on, upon reception of either a start pulse S or an inverted start pulse $\overline{S}$ of inverted polarity on a start pulse input terminal 34*a* or 34*b*, to supply the passive circuit 30 with either of the voltages E or −E continuously applied to power input terminal means 35*a* and 35*b*. The both-sign exponential function generator 18B produces the voltage $g(t)$ upon reception of a start pulse S and the other voltage $-g(t)$ upon reception of an inverted start pulse $\overline{S}$.

An analogue signal, such as a voice signal, having substantially symmetrical probability distribution of the amplitudes on both the positive and the negative directions may be logarithmically quantized by discriminating the sign of the input voltage by means of a comparator (not shown), such as a Schmidt circuit, disposed in the encoder of FIG. 1 at an optimal position between the input terminal 11 and the sampling circuit 12, by controlling by a pulse-like voltage representing the result of the discrimination a polarity inverter (not shown) interposed between the start pulse input terminal 16 and the function generator 18, and by employing a bidirectional exponential function generator 18B as the function generator 18.

The exponential function generator explained above had a passive circuit 30 composed of a parallel circuit of a resistor R and a capacitor C. It is, however, clearly to be understood that an exponential function generator may be composed of other passive circuit elements such as comprising an inductor and a resistor so as to utilize the natural discharge characteristics of the passive circuit.

Referring to FIG. 4, it will become clear that in an encoder with logarithmic quantization comprising an exponential function generator 18′ having the described passive circuit 30 it is possible to skillfully compensate the undesirable error which has been unavoidably caused in an encoder of the counter type with linear quantization by the fact that the sampled voltage held in the sampled voltage holding circuit 13 is in fact not constant but a function $v(t)$ of the time $t$. The circuit diagram of a portion of the encoder shown in FIG. 4 is illustrated in a more practical form than the corresponding portion shown in FIG. 1. In the circuit shown in FIG. 4, an input voltage V applied to an input terminal 11 is supplied through a transformer 41 to a sampling circuit 12 to be converted there to a sampled voltage V. The sampled voltage V charges a capacitor $C_0$ up to a voltage $v$ within a very short sampling period during which sampling is performed. Generally, the input impedance of a comparator 20′ is non-linear and consequently the sampled voltage holding circuit 13 has in shunt with the capacitor $C_0$ a resistor $R_0$ whose resistance is smaller than the input impedance. The stored sampled voltage $v$, therefore, exponentially decreases with the time constant $R_0C_0$ in accordance with a relation $$v(t)=v_0\cdot\exp(-t/[R_0\cdot C_0])$$

where $v_0$ is the initial value of $v$, $R_0$ is the resistance of the resistor $R_0$, and $C_0$ is the electrostatic capacity of the capacitor $C_0$. In an exponential function generator 18′, a capacitor C in a passive circuit 30 is charged with the voltage E supplied from a power source E by a switching circuit 32 which is turned on by a start pulse S supplied to a start pulse input terminal 16 at the time point corresponding to the sampling time. Inasmuch as a single-input comparator 20′ is preferable as the comparator, the reference voltage $g(t)$ obtained by discharging in the passive circuit 30 through a resistor R the electric charge stored in the capacitor C is in practice led to the sampled voltage holding circuit 13 to derive a difference voltage $g(t)-v(t)$ at the output terminal of such holding circuit 13 and the sign of the difference voltage is discriminated in the comparator 20′. The comparator 20′ produces an output pulse at an instant when the difference voltage $g(t)-v(t)$ decreases from positive to negative or when $$g(t)=v(t)$$

to bring to an end the gate pulse G which is the output of a flip-flop circuit 21.

The ratio of the reference voltage $g(t)$ to the stored sampled voltage $v(t)$ is $$\begin{aligned} g(t)/v(t)&=E\cdot\exp(-t/[R\cdot C])/[v\cdot\exp(-t/[R_0\cdot C_0])] \\ &=(E/v)\cdot\exp(-t\cdot[1/(R\cdot C)+1/(R_0\cdot C_0)]) \end{aligned}$$

Inasmuch as the comparator 20′ produces an output pulse when $g(t)=v(t)$, selection of the resistance R and the electrostatic capacity C of the exponential function generator 18′ such that $$1/(R\cdot C)+1/(R_0\cdot C_0)=f_0\cdot\log r$$

may hold instead of the Equation 8, makes the duration of the gate pulse G equivalent to that which results if the stored sampled voltage $v(t)$ could be kept perfect.

As has been explained, encoding is possible with an encoder of the counter type according to the invention with any non-linear companding characteristics and, when the non-linearity is logarithmic, with excellent stability and precision. The invention is also applicable to a logarithmically scaled meter such as a digital decibel meter with decibel readings.

While the invention has been described, it is to be clearly understood that the patent right given to the application covers any one of the encoders to be set forth in the following claims for patent.

What is claimed is:

1. An encoder with logarithmic quantization for encoding an input analogue voltage comprising a function generator for producing a reference voltage varying according to an exponential function with time as measured from a predetermined start time point, a comparator for comparing said analogue voltage and said reference voltage to produce an output signal when a predetermined relation holds between such voltages, and means for providing a digital signal in proportion to the number of time units contained in the time interval from said start time point to the time point of occurrence of said output signal, said function generator comprising a passive decay network, and means for impressing a fixed voltage for a predetermined time upon said network.

2. An encoder according to claim 1 wherein said passive network comprises a passive charge storing element, and a resistor connected in shunt with said storing-element, whereby said output waveform is produced by natural discharge characteristics of said network.

3. An encoder according to claim 1 for the comprising of a sampling circuit for deriving a sample of said analogue wave, and a sample storage circuit comprising a condenser and a shunt resistor connected to said comparator, wherein said function generator comprises a condenser and a parallel resistor connected to said comparator in series with said sample storage circuit, the condensers and resistors of said sample storage circuit and said function generator having such values as to compensate for leakage of said stored sample voltage.

4. An encoder comprising a sampling circuit for obtaining a sample voltage of an analogue wave at undetermined time intervals a function generator including a decay network for generating a single valued exponential wave form, a comparator for comparing said sample voltage and said generated waveform voltage during a predetermined time interval to produce an output pulse upon a predetermined relation between said voltages, a counting pulse source for producing pulses at regularly timed intervals, within said pretermined time interval, a counting circuit for producing output code combinations in binary form corresponding with the number of pulses counted, upon termination of a count, a gating circuit for applying pulses from said counting pulse source to said counting circuit, means for timing operation of said sampling circuit, said function generator and reset of said counting circuit to occur simultaneously, and a gating pulse producer having its operation initiated in timed sequences with said sampling and terminated with said output pulse for gating counting pulses to said counting circuit.

5. An encoder according to claim 4 wherein said function generator comprises a network having a passive storage reactance device, and a discharge resistor connected in parallel with said device, said network having a time constant substantially equal to said predetermined time interval.

6. An encoder according to claim 5 wherein said function generator includes a source of voltage for charging said storage device to an initial voltage slightly greater than the maximum amplitude of the analogue wave.

7. A counter-type coder for encoding a sample voltage of an analogue signal comprising:

means for storing said sample voltage for a predetermined time interval;

means including a fixed voltage source and a shunt capacitor and resistor for producing an exponentially decreasing reference voltage;

means for initiating a comparison between said sample voltage and said reference voltage at a time coincident with the leading edge of said exponentially decreasing voltage and for producing an output signal when a predetermined relation exists between said voltages;

and means for producing a digital signal depending upon the number of time units contained in the time interval from the initiation of said comparison until the time point of the occurrence of said output signal.

References Cited by the Examiner

UNITED STATES PATENTS 2,787,418 4/1957 MacKnight et al. ______ 235—61

OTHER REFERENCES

Tou, Julius T.: Digital and Sampled Data Control Systems, N.Y., McGraw-Hill, 1959, pp. 378–380. (Copy in Group 240.)

Glaser and Blasbalg: A Logarithmic Voltage Quantizer, I.R.E. Transactions, Electronic Computers, December 1955, pp. 150–154.

MAYNARD R. WILBUR, *Primary Examiner.*

DARYL W. COOK, *Examiner.*

W. J. ATKINS, *Assistant Examiner.*